(12) United States Patent
Yamasaki et al.

(10) Patent No.: US 7,341,919 B2
(45) Date of Patent: Mar. 11, 2008

(54) CAPACITOR ELEMENT, MANUFACTURING METHOD THEREFOR, SEMICONDUCTOR DEVICE SUBSTRATE, AND SEMICONDUCTOR DEVICE

(75) Inventors: Tomoo Yamasaki, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 185 days.

(21) Appl. No.: 11/226,535

(22) Filed: Sep. 14, 2005

(65) Prior Publication Data

US 2006/0008579 A1    Jan. 12, 2006

Related U.S. Application Data

(62) Division of application No. 10/782,557, filed on Feb. 19, 2004, now Pat. No. 7,115,931.

(30) Foreign Application Priority Data

Feb. 26, 2003  (JP)  ............................. 2003-049716

(51) Int. Cl.
   *H01L 21/8222*   (2006.01)
(52) U.S. Cl. ........................................ 438/329; 427/79

(58) Field of Classification Search ................ 438/329, 438/309–378; 427/79
See application file for complete search history.

(56) References Cited

U.S. PATENT DOCUMENTS

| | | | |
|---|---|---|---|
| 5,321,210 A * | 6/1994 | Kimbara et al. ............ 174/256 |
| 6,184,577 B1 | 2/2001 | Takemura et al. |
| 6,223,429 B1 | 5/2001 | Kaneda et al. |
| 6,395,658 B1 | 5/2002 | Taira et al. |
| 6,775,150 B1 | 8/2004 | Chakravorty et al. |
| 6,876,554 B1 | 4/2005 | Inagaki et al. |
| 2003/0217858 A1 | 11/2003 | Ho et al. |

FOREIGN PATENT DOCUMENTS

JP       2001274034        10/2001

* cited by examiner

*Primary Examiner*—Mary Wilczewski
*Assistant Examiner*—Seth Barnes
(74) *Attorney, Agent, or Firm*—Ladas & Parry LLP

(57) ABSTRACT

A capacitor element configured to mount a semiconductor element thereon includes a base. A capacitor part is provided on the base. The base is made of a resin whose coefficient of linear expansion is adjusted in accordance with a coefficient of linear expansion of the semiconductor element mounted on the capacitor element.

12 Claims, 10 Drawing Sheets

CAPACITOR ELEMENT, MANUFACTURING METHOD THEREFOR, SEMICONDUCTOR DEVICE SUBSTRATE, AND SEMICONDUCTOR DEVICE

BACKGROUND OF THE INVENTION

1. Field of the Invention

The present invention relates to capacitor elements, manufacturing methods therefor, and substrates for semiconductor devices having capacitor elements.

2. Description of the Related Art

Recently, in semiconductor devices, operating frequencies of semiconductor elements thereof are becoming higher. Based on this, it is becoming necessary to stabilize power supply voltages supplied to the semiconductor elements. In order to deal with this necessity, a structure has been proposed in which a capacitor element is provided in a substrate (semiconductor device substrate) for a semiconductor device on which substrate a semiconductor element is mounted.

Figure 1:
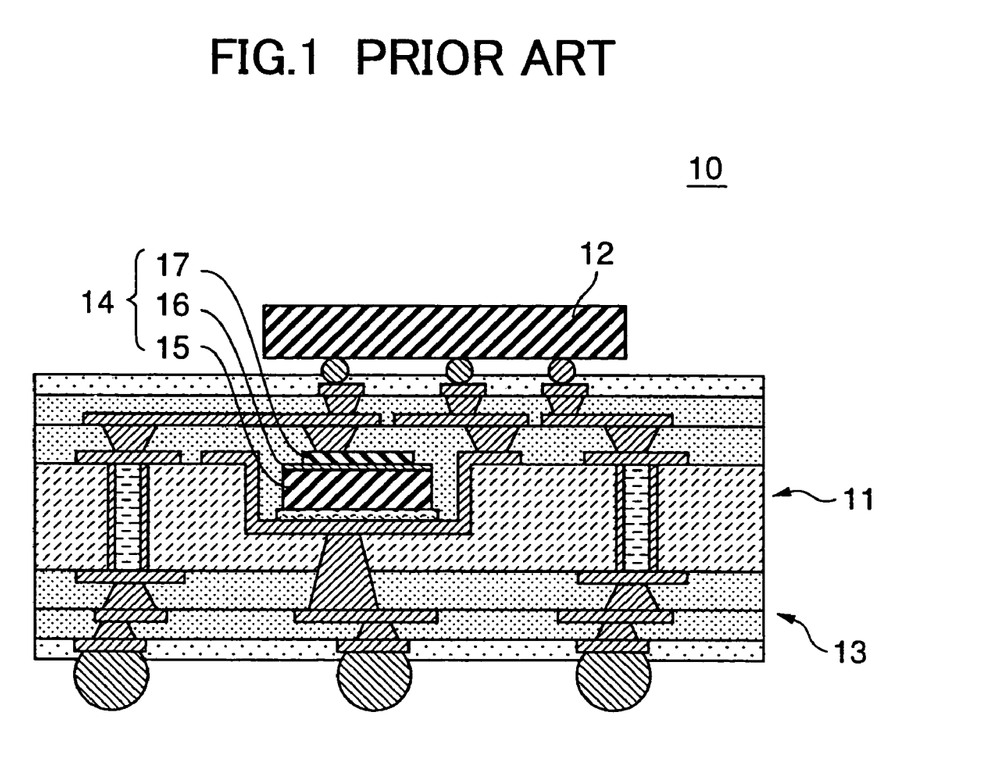
FIG. 1 is a schematic diagram showing a conventional example.

FIG. 1 shows a conventional semiconductor device 10. The semiconductor device 10 has a structure in which a semiconductor element 12 is mounted on a semiconductor device substrate 11. The substrate 11 has a structure in which a capacitor element 14 is provided inside a substrate body 13. The capacitor element 14 has a structure in which a film 16 made of a dielectric material is formed on a top surface of a silicon substrate 15, and a conductive film 17 is formed on the film 16 (refer to Japanese Laid-Open Patent Application No. 2001-274034, for example).

The capacitor element 14 has the structure in which the silicon substrate 15 serves as the base. Hence, when forming a through-hole in the silicon substrate 15, it is necessary to perform dry etching, wet etching, or laser processing, for example, which results in a further process in manufacturing. In addition, since the silicon substrate 15 is a semiconductor, it is necessary to form an insulating film on the inside surface of the through-hole and the top surface of the silicon substrate 15 before filling the through-hole with Cu, for example, so as to secure insulation. This also results in a further process in manufacturing.

When the thickness of a silicon substrate is reduced, the strength is decreased and cracking tends to occur. Hence, it is difficult to reduce the thickness. Here, the base is the silicon substrate 15. Thus, the thickness of the capacitor element 14 cannot be reduced, and the thickness of the substrate 11 is increased for that amount.

The capacitor element 14 is arranged at a position distant from a semiconductor element mounting surface of the substrate 11. Thus, the conductive channel between the semiconductor element 12 and the capacitor element 14 is long, and the inductance thereof is high. Hence, in a case where the operating frequency of the semiconductor element 12 becomes higher, there is the possibility that stabilization of power supply voltage supplied to the semiconductor element 12 becomes difficult due to the inductance.

SUMMARY OF THE INVENTION

A general object of the present invention is to provide an improved and useful capacitor element, a manufacturing method therefor, and a substrate (semiconductor device substrate) for a semiconductor device having the capacitance element in which one or more of the above-mentioned problems are eliminated.

Another object of the present invention is to provide a capacitor element embedded in a semiconductor device substrate, having a reduced thickness, and improving productivity.

In order to achieve the above-mentioned objects, according to one aspect of the present invention, there is provided a capacitor element configured to mount a semiconductor element thereon, the capacitor element including:

a base; and a capacitor part provided on the base, wherein the base is made of a resin whose coefficient of linear expansion is adjusted in accordance with a coefficient of linear expansion of the semiconductor element.

Since the base is made of the resin, it becomes easier to reduce the thickness of a capacitor element compared to that of a capacitor having a silicon substrate as the base. In addition, since the capacitor element is thin, the thickness of a substrate for mounting an element embedding the capacitor element therein is also reduced.

Additionally, since the base is made of the resin whose coefficient of linear expansion is adjusted, in a case where an element is mounted on the substrate embedding the capacitor element therein, heat stress generated between the capacitor element and the mounted element is controlled to be small.

In the above-mentioned capacitor element, the base may be made of an epoxy resin including a filler for adjusting the coefficient of linear expansion of the epoxy resin to fall within the range of 5-30 ppm/K.

In this case, since the base is made of epoxy resin whose coefficient of linear expansion is within the range of 5-30 ppm/K, the coefficient of linear expansion of the capacitor element becomes close to that of a semiconductor element having a silicon substrate. Consequently, when the semiconductor element is mounted on the semiconductor device substrate embedding the capacitor element therein, heat stress generated between the capacitor element and the mounted semiconductor element is controlled to be small.

Additionally, the base may be made of a polyimide resin including a filler for adjusting the coefficient of linear expansion of the polyimide resin to fall within the range of 5-30 ppm/K.

Since the base is made of polyimide resin whose coefficient of linear expansion is within the range of 5-30 ppm/K, the coefficient of linear expansion of the capacitor element becomes close to that of a semiconductor element having a silicon substrate. Accordingly, when the semiconductor element is mounted on the substrate embedding the capacitor element therein, heat stress generated between the capacitor element and the mounted semiconductor element is controlled to be small.

Additionally, the base may be made of thermoplastic liquid crystal polymer whose coefficient of linear expansion is within the range of 5-30 ppm/K.

Since the base is made of thermoplastic liquid crystal polymer whose coefficient of linear expansion is within the range of 5-30 ppm/K, the coefficient of linear expansion of the capacitor element becomes close to that of a semiconductor element having a silicon substrate. Thus, when the semiconductor element is mounted on the substrate embedding the capacitor element therein, heat stress generated between the capacitor element and the mounted semiconductor element is controlled to be small.

Additionally, the base may be made of a resin including aramid fiber for adjusting the coefficient of linear expansion of the resin to fall within the range of 5-30 ppm/K.

Since the base is made of the resin whose coefficient of linear expansion is within the range of 5-30 ppm/K, the coefficient of linear expansion of the capacitor element becomes close to that of a semiconductor element having a silicon substrate. Thus, when the semiconductor element is mounted on the substrate embedding the capacitor element therein, heat stress generated between the capacitor element and the mounted semiconductor element is controlled to be small.

Additionally, according to another aspect of the present invention, there is provided a method of manufacturing a capacitor element including the steps of:

applying on a surface of a base material a base made of a resin whose coefficient of linear expansion is adjusted in accordance with a coefficient of linear expansion of a semiconductor element mounted on the capacitor element;

forming vias in the base;

forming a conductive layer on a top surface of the base;

patterning the conductive layer so as to form terminals filling in the vias and lower electrodes extending to the top surface of the base;

forming a dielectric layer on the lower electrodes;

forming a conductive layer on a top surface of the dielectric layer; and patterning the conductive layer so as to form on the dielectric layer an upper electrode opposing the lower electrodes and so as to form a terminal having an exposed top surface.

Since the base made of resin is used, compared to the case where a silicon substrate is used, formation of the vias becomes easier. Thus, it becomes possible to reduce the time interval required for an operation to form the vias. In addition, since the base is made of insulative resin, it becomes possible to directly form a conductive layer on the top surface of the base without forming an insulating film. Accordingly, compared to the case where a silicon substrate is used, manufacturing processes are reduced.

Additionally, according to another aspect of the present invention, there is provided a semiconductor device substrate on which a semiconductor element may be mounted, the semiconductor device substrate including:

a substrate body having a bottom surface that serves as a mounting surface in which external connection terminals are arranged; and a capacitor element including:

a base made of a resin whose coefficient of linear expansion is adjusted in accordance with the semiconductor element to be mounted;

a capacitor part including two opposing electrodes and a dielectric layer interposed therebetween;

a plurality of terminals in a top surface of the capacitor element; and a plurality of terminals in a bottom surface of the capacitor element, the capacitor element being embedded in the substrate body, a top surface of the capacitor element being exposed at a top surface of the substrate body and serving as a surface on which the semiconductor element may be mounted.

Since the capacitor element includes the base made of resin and thus the thickness of the capacitor element is reduced, it also becomes possible to reduce the thickness of a substrate (semiconductor device substrate) for semiconductor device. In addition, the top surface of the capacitor element serves as a surface (semiconductor element mounting surface) on which a semiconductor element is mounted. Thus, the length of a conductive channel between the capacitor part and the semiconductor element mounting surface is shorted to such an extent that the length cannot be made any shorter. Accordingly, it becomes possible to reduce parasitic inductance, which is inductance of the conductive channel between the capacitor part and terminals on the semiconductor element mounting surface, to such an extent that the parasitic inductance cannot be reduced any further. Hence, even if a semiconductor element is mounted that is operated at a high speed and is subject to parasitic inductance, power supply voltage is stabilized. Thus, the semiconductor device substrate is suitable for mounting a semiconductor element operated at a high speed.

Additionally, according to another aspect of the present invention, there is provided a semiconductor device including:

the semiconductor device substrate as mentioned above; and a semiconductor element, the semiconductor element being mounted on a top surface of the semiconductor device substrate at which the capacitor element is exposed.

Since the semiconductor element is mounted on the top surface of the capacitor element, the length of a conductive channel between the mounted semiconductor element and the capacitor part is shortened to such an extent that the length cannot be made any shorter. Accordingly, it becomes possible to reduce parasitic inductance, which is inductance of the conductive channel between the mounted semiconductor element and the capacitor part, to such an extent that the parasitic inductance cannot be reduced any further. Hence, even if a semiconductor element is mounted that is operated at a high speed and is subject to the parasitic inductance, power supply voltage is stabilized. In addition, heat stress generated between the capacitor element and the semiconductor element is controlled to be small.

Other objects, features and advantages of the present invention will become more apparent from the following detailed description when read in conjunction with the following drawings.

DETAILED DESCRIPTION OF THE PREFERRED EMBODIMENTS

Descriptions are given below in the order of a capacitor element, a manufacturing method therefor, a substrate (hereinafter referred to as a "semiconductor device substrate") for a semiconductor device, a semiconductor device, and a manufacturing method of the semiconductor device substrate.

First, a description is given below of one embodiment of a capacitor element and a manufacturing method therefor.

Figure 2:
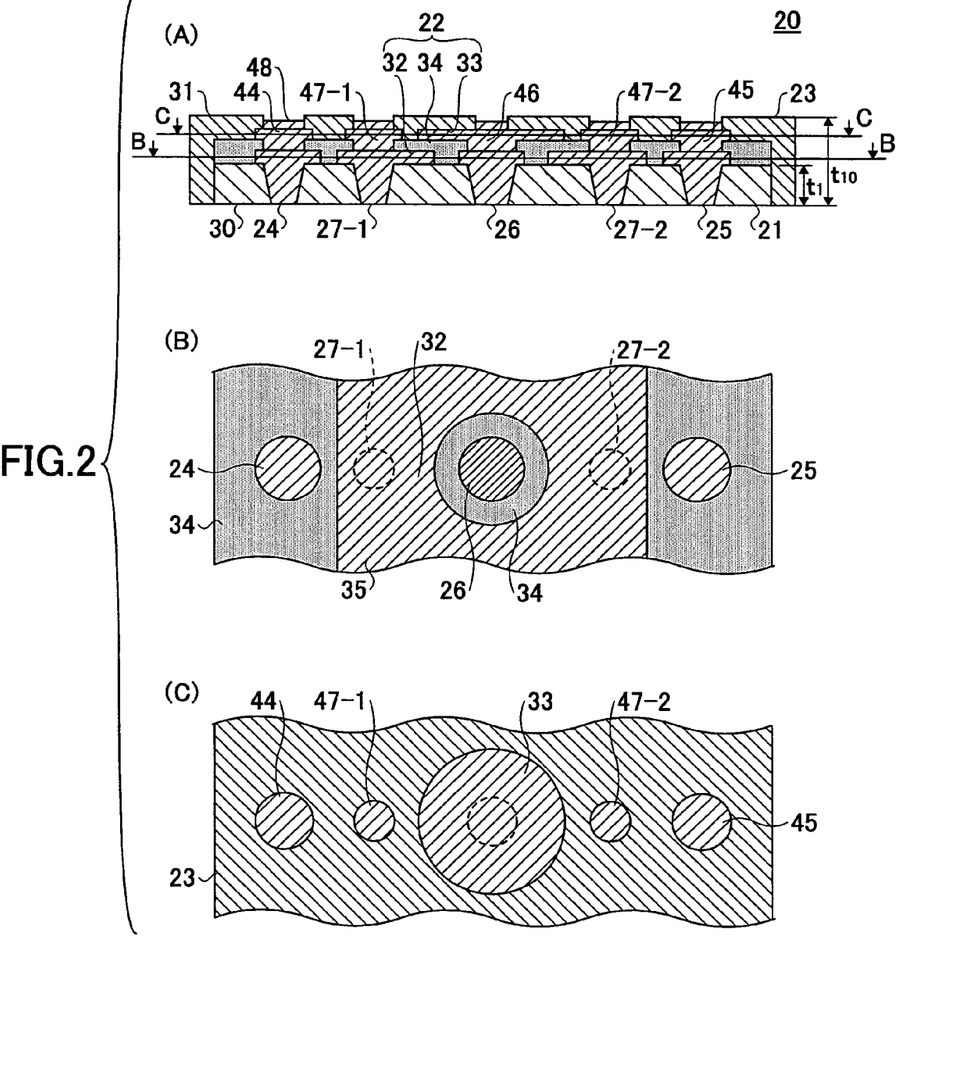
FIG. 2 is a schematic diagram showing a capacitor element according to one embodiment of the present invention.

FIG. 2-(A) shows a capacitor element 20 according to one embodiment of the present invention. The capacitor element 20 is in a sheet fragment-like shape. FIG. 2-(B) and FIG. 2-(C) show cross-sectional views taken along the lines B-B and C-C in FIG. 2-(A), respectively.

Figure 6:
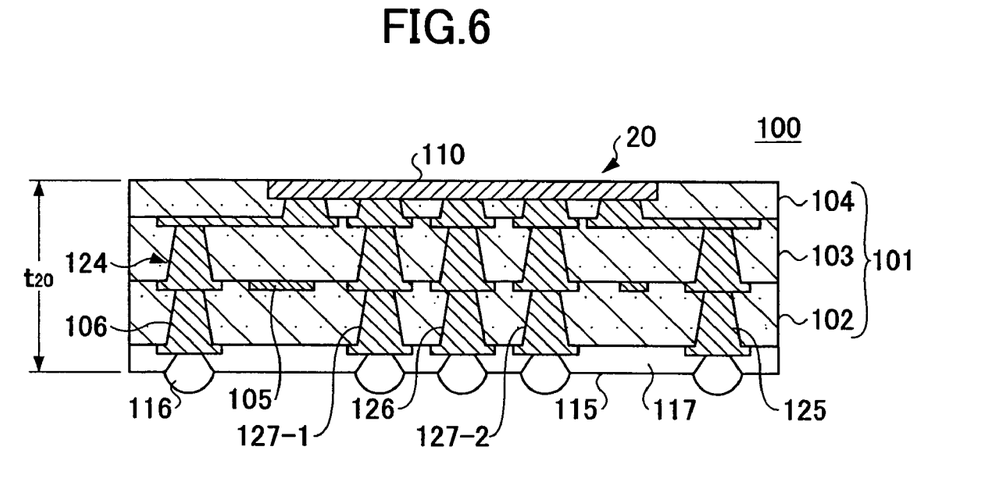
FIG. 6 is a schematic diagram showing a semiconductor device substrate according to one embodiment of the present invention.
Figure 8:
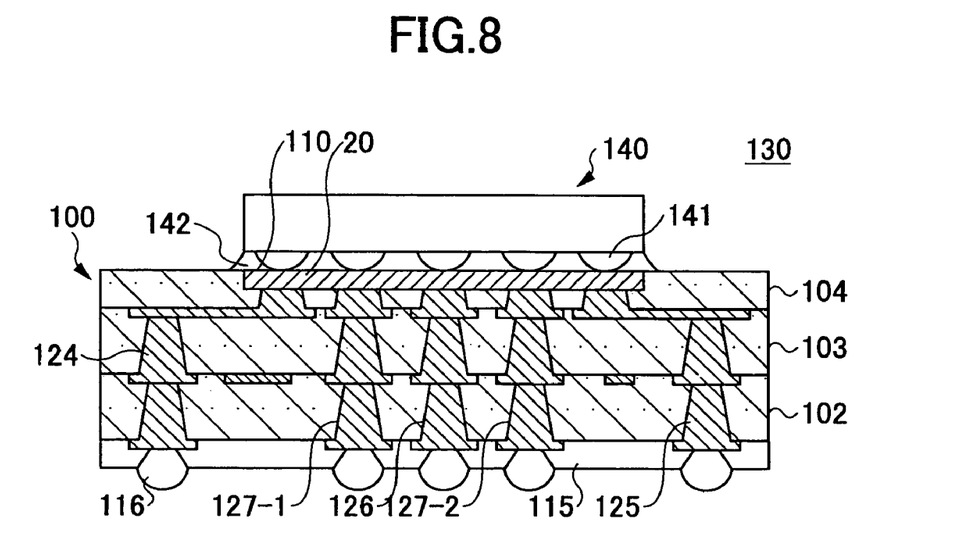
FIG. 8 is a schematic diagram showing a semiconductor device having the semiconductor device substrate shown in FIG. 6.

As shown in FIG. 6, the capacitor element 20 is used by being embedded in a semiconductor device substrate 100 such that the capacitor element 20 is exposed at the surface of the semiconductor device substrate 100. The capacitor element 20 constitutes a part of the semiconductor device substrate 100, and forms a mounting portion for a semiconductor element. As shown in FIG. 8, an LSI semiconductor element 140 is mounted on the mounting portion, thereby constituting a semiconductor device 130.

As shown in FIG. 2-(A), the capacitor element 20 includes a base 21 serving as a core substrate; a thin film capacitor part (capacitor part) 22 formed on the top surface of the base 21; an insulative protective film (protective film) 23 covering the capacitor part 22 and formed above the base 21; lower terminals (signal lower terminals) 24 and 25 for signal, a lower terminal (power source lower terminal) 26 for power source, and two lower terminals (grounding lower terminals) 27-1 and 27-2 for grounding that are exposed at a bottom surface 30 of the capacitor element 20; and upper terminals (signal upper terminals) 44 and 45 for signal, an upper terminal (power source upper terminal) 46 for power source, and two upper terminals (grounding upper terminals) 47-1 and 47-2 for grounding that are arranged in a top surface 31 of the capacitor element 20.

The base 21 is a sheet fragment made of epoxy resin including a silica inorganic filler. The base 21 includes the silica inorganic filler for adjusting the coefficient of linear expansion. The coefficient of linear expansion of the base 21 is adjusted to fall within the range of 5-30 ppm/K in consideration of the coefficient of linear expansion (approximately 3 ppm/K) of a silicon substrate, which serves as a core substrate of the LSI semiconductor device 140. Since the base 21 is made of epoxy resin, it is not difficult to reduce a thickness t1 to be less than 50 μm. Moreover, even if the thickness t1 is less than 50 μm, mechanical strength is sufficiently high, and further, flexibility is provided.

The signal upper terminals 44 and 45, the power source upper terminal 46, and the two grounding upper terminals 47-1 and 47-2 are arranged so as to correspond to bumps 141 of a semiconductor element to be mounted. The two upper terminals 47-1 and 47-2 are positioned on both sides of the upper terminal 46. Each of the signal upper terminals 44 and 45, the power source upper terminal 46, and the grounding upper terminals 47-1 and 47-2 includes a Ni/Au plating part 48. Thus, oxidization of exposed surfaces of the signal upper terminals 44 and 45, the power source upper terminal 46, and the grounding upper terminals 47-1 and 47-2 that are made of Cu is prevented. The signal lower terminals 24 and 25, the power source lower terminal 26, and the two grounding lower terminals 27-1 and 27-2 correspond to the signal upper terminals 44 and 45, the power source upper terminal 46, and the two grounding upper terminals 47-1 and 47-2, respectively.

The capacitor part 22 has a structure in which a lower electrode 32 and an upper electrode 33 face each other and have interposed therebetween a tantalum anodized oxide layer (dielectric layer, hereinafter referred to as a "anodized oxide layer") 34. The capacitor part 22 is arranged on the base 21, and covered and protected by the protective film 23. The anodized oxide layer 34 is formed on a surface of the lower electrode 32. The lower electrode 32 shown in the left portion of FIG. 4-(A) is electrically connected with the lower terminal 27-1, and the lower electrode 32 shown in the right portion of FIG. 4-(A) is electrically connected with the lower terminal 27-2. The upper electrode 33 is electrically connected with the power source lower terminal 26. The capacitor part 22 is provided between the power source lower terminal 26 and the grounding lower terminals 27-1 and 27-2. When the capacitor element 20 is embedded in a semiconductor device substrate as described later, a semiconductor device including a semiconductor element is mounted on a printed-circuit board, and the semiconductor device is operated, the capacitor part 22 functions as a bypass capacitor or a decoupling capacitor. Consequently, the power supply voltage supplied to the semiconductor element is stabilized.

When the capacitor element 20 does not have a semiconductor element mounted thereon, regarding the capacitor part 22, the source lower terminal 26 and the power source upper terminal 46 form one terminal, and the grounding lower terminal 27-1 and the grounding upper terminal 47-1 form the other terminal.

Since the base 21 is the sheet fragment having the thickness t1 less than 50 μm, a thickness t10 of the capacitor element 20 is small. In addition, since the base 21 has flexibility, the capacitor element 20 also has flexibility.

It should be noted that the coefficient of linear expansion of the capacitor element 20 corresponds to that of the base 21 and is within the range of 5-30 ppm/K. As described later, the coefficient of linear expansion of the capacitor element 20 has the intermediate characteristic between that of a substrate body for a semiconductor device and that (approximately 3 ppm/K) of a silicon substrate that is a material of the semiconductor element, and has a value close to the coefficient of linear expansion of a silicon substrate. Accordingly, in the semiconductor device 130, which is shown in FIG. 8 and described later, heat stress between the semiconductor element and the capacitor element 20, and heat stress between the capacitor element 20 and the substrate body for the semiconductor device 130 are both decreased and improved.

It should be noted that the base 21 may be a sheet fragment made of polyimide resin including a silica inorganic filler and having a coefficient of linear expansion within the range of 5-30 ppm/K. Additionally, the base 21 may be a thermoplastic liquid crystal polymer whose coefficient of linear expansion is within the range of 5-30 ppm/K. Further, the base 21 may be made of an epoxy resin including aramid fiber and having a coefficient of linear expansion within the range of 5-30 ppm/K.

Next, referring to FIGS. 3, 4 and 5, a description is given below of a manufacturing method of the above-mentioned capacitor element 20.

In practice, the capacitor element 20 is manufactured by arranging and forming a large number of pairs of capacitor parts 22 in a matrix-like manner on a large size resin sheet, and individualizing them at last. For convenience of explanation, however, a description is given of a method of manufacturing one capacitor element 20 by processing the base 21 having the size corresponding to the capacitor element 20.

Figure 3:
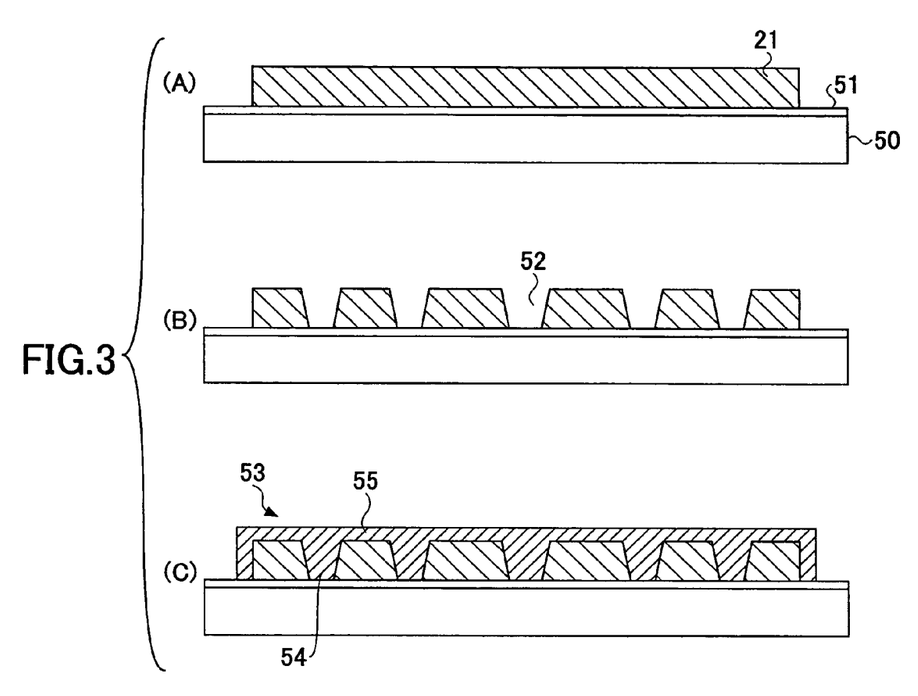
FIG. 3 is a schematic diagram showing a manufacturing flow of the capacitor element shown in FIG. 2.

First, as shown in FIG. 3-(A), a release agent film 51 is formed on the top surface of a base material 50, and the base 21 is applied on the release agent film 51. A film of Cr, Ni, or Sn may be used as a substitute for the release agent film 51.

Then, as shown in FIG. 3-(B), vias 52 are formed in the base 21 by laser processing or dry etching, for example. Since the base 21 is made of epoxy resin, formation of the vias 52 is completed in a shorter time interval compared to the case of forming vias in a silicon substrate.

Then, as shown in FIG. 3-(C), electroless copper plating and electrolytic copper plating are conducted on surfaces of the base 21 so as to form a copper plating layer 53 such that the copper plating layer 53 covers the top surfaces and side surfaces of the base 21 and fills in the vias 52. In FIG. 3-(C), 54 denotes copper portions that fill in the vias 52, and 55 denotes a copper layer on the top surfaces of the base 21. A conductive resin film may be formed on the surfaces of the base 21 as a substitute for the copper plating layer 53.

Figure 4:
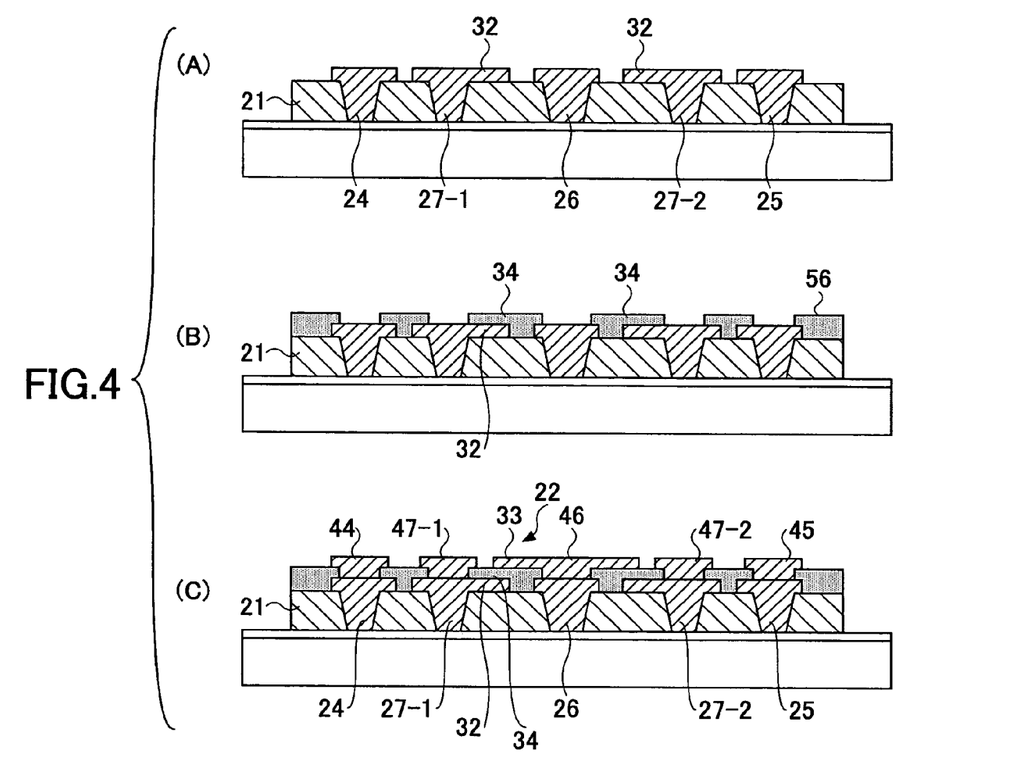
FIG. 4 is a schematic diagram showing the subsequent manufacturing flow of that shown in FIG. 3.

Then, as shown in FIG. 4-(A), the copper layer 55 is subjected to patterning, thereby segmentalizing the copper portions 54 that fill in the respective vias 52 so as to form the signal lower terminals 24 and 25, the power source lower terminal 26, and the two grounding lower terminals 27-1 and 27-2, and forming the lower electrodes 32 extending toward the power source lower terminal 26 from the lower terminals 27-1 and 27-2 (refer to FIG. 2-(B)).

Then, as shown in FIG. 4-(B), a tantalum film (34 and 56) is formed on surfaces of the base 21 by sputtering tantalum thereon, and a tantalum oxide film is formed by anodizing the tantalum film.

Then, the tantalum oxide film is subjected to etching and patterning such that the tantalum oxide film remains on the lower electrodes 32, and the top surfaces of the signal lower terminals 24 and 25, the power source lower terminal 26, and the grounding lower terminals 27-1 and 27-2 are exposed, thereby forming dielectric layers 56 (refer to FIG. 2-(B)). Among the dielectric layers 56, those formed on the lower electrodes 32 constitute the dielectric layers 34 of the capacitor part 22. Sputtering of tantalum is conducted at a temperature of 200° C. or less. Hence, the dielectric layers 34 are formed without giving detrimental effect on the base 21 that is made of epoxy resin. It should be noted that Ti, Si, or Al, for example, which are valve metals, may be used as a substitute for tantalum.

Then, as shown in FIG. 4-(C), electroless copper plating is conducted on the surfaces of the dielectric layers 34 so as to form a copper plating layer 53. The copper plate layer 53 is subjected to etching and patterning such that the copper plating layer 53 remains on the top surfaces of the dielectric layers 34 and the top surfaces of the signal lower terminals 24 and 25, the power source lower terminal 26, and the grounding lower terminals 27-1 and 27-2, thereby forming the upper electrode 33, the signal upper terminals 44 and 45, the power source upper terminal 46, and the two grounding upper terminals 47-1 and 47-2 (refer to FIG. 2-(C)). Upon formation of the upper electrode 33, the capacitor part 22 is constructed.

Figure 5:
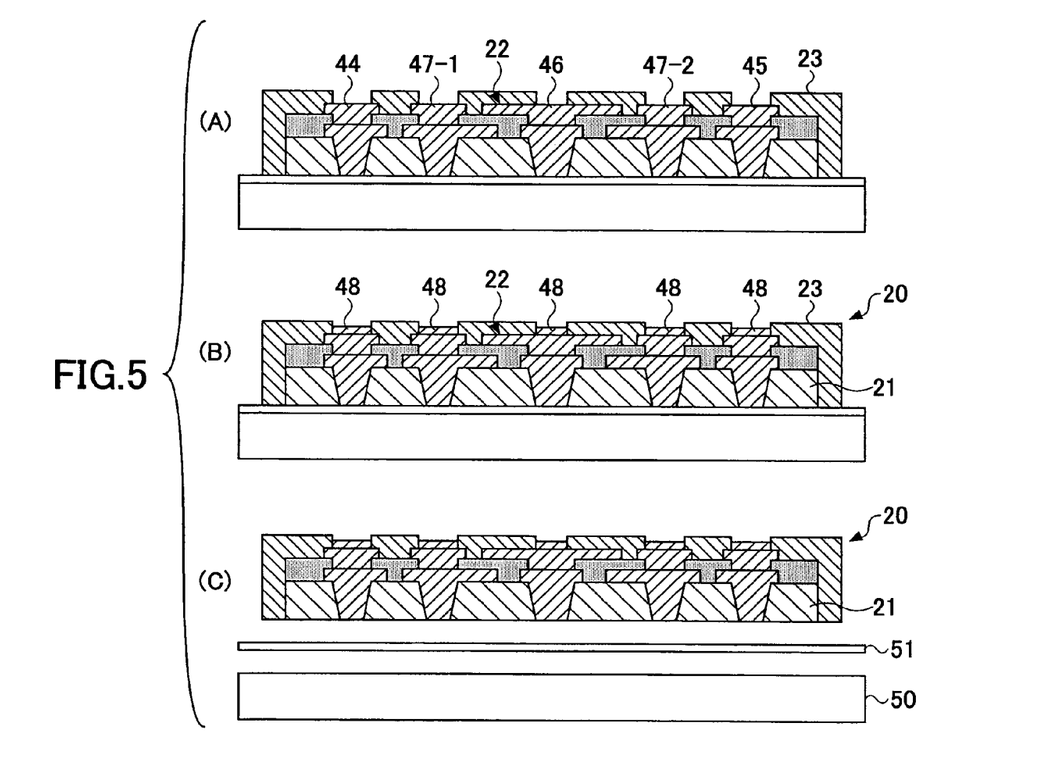
FIG. 5 is a schematic diagram showing the subsequent manufacturing flow of that shown in FIG. 4.

Then, as shown in FIG. 5-(A), an insulative film is formed on the top surfaces and the peripheral side surfaces by forming photosensitive resist. The insulative film is subjected to patterning such that the signal upper terminals 44 and 45, the power source upper terminal 46, and the grounding upper terminals 47-1 and 47-2 are exposed, thereby forming the protective film 23 (refer to FIG. 2-(C)).

Then, as shown in FIG. 5-(B), the Ni/Au plating parts 48 are formed by performing surface treatment on the exposed top surfaces of the signal upper terminals 44 and 45, the power source upper terminal 46, and the grounding upper terminals 47-1 and 47-2 by conducting Ni/Au plating. Here, the capacitor element 20 is completed on the base 21.

Finally, as shown in FIG. 5-(C), the capacitor element 20 is separated from the base material 50 by reducing adhesion of the release agent film 51 by illuminating light or applying heat. When the base material 50 is a glass board, it is preferred to illuminate light. Additionally, in FIG. 3-(A), when a film of Cr, Ni, or Sn is formed as a substitute for the release agent film 51, the film of Cr, Ni, or Sn is removed by wet etching, thereby separating the capacitor element 20 from the base material 50.

Next, a description is given below of a semiconductor device substrate.

Figure 7:
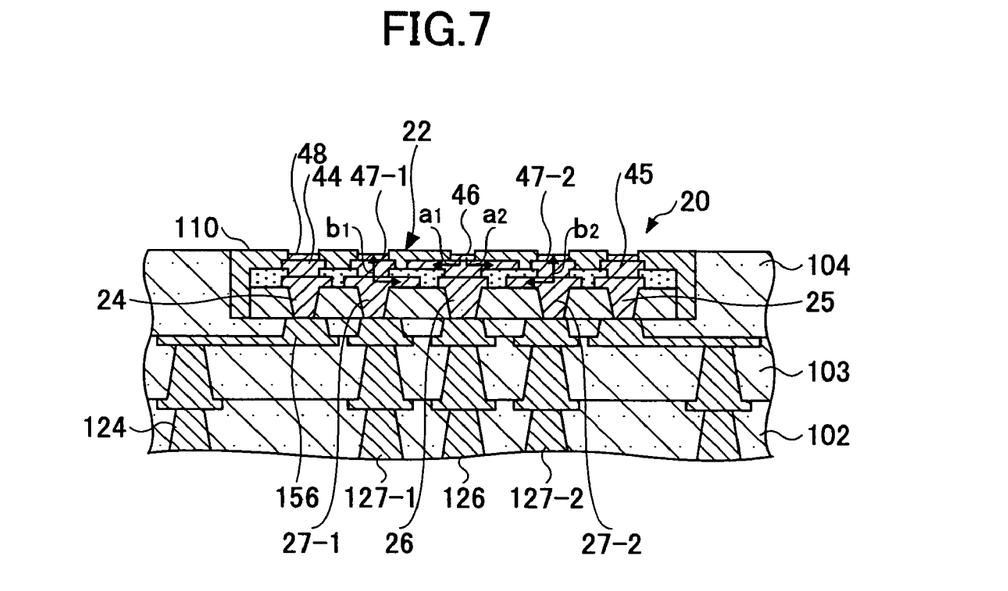
FIG. 7 is a schematic diagram showing an internal structure of the capacitor element and a connection part of the capacitor element and the substrate shown in FIG. 6 in an enlarged manner.

FIG. 6 shows the substrate 100 for semiconductor device. FIG. 7 shows a part of the substrate 100 in an enlarged manner.

The substrate 100 includes a substrate body 101 and the capacitor element 20 embedded in the top surface of the substrate body 101. The capacitor element 20 is embedded in a resin layer 104 with the top surface exposed at the top surface of the substrate 100. The substrate body 101 is a multilayer circuit board in which resin layers 102, 103 and 104 are stacked. A conductive pattern formed for each of the layers 102, 103 and 104 is electrically connected by vias 106 that run through each of the layers 102, 103 and 104. Conductive channels (signal conductive channels) 124 and 125 for signal, a conductive channel (power source conductive channel) 126 for power source, and conductive channels (grounding conductive channels) 127-1 and 127-2 for grounding are formed inside the substrate body 101 such that the above-mentioned channels run through the substrate body 101 in the thickness direction thereof.

110 denotes a surface on which a semiconductor element is mounted. The surface 110 is the top surface of the capacitor element 20. As shown in FIG. 7, the signal upper terminals 44 and 45, the power source upper terminal 46, and the two grounding upper terminals 47-1 and 47-2 are arranged in the surface 110.

115 (FIG. 6) denotes a mounting surface, which is the bottom surface of the substrate body 101. Solder balls 116 are provided in the mounting surface 115 such that the solder balls 116 are connected to the vias 106. The mounting surface 115 is covered with solder resist 117.

The signal lower terminals 24 and 25, the power source lower terminal 26, and the grounding lower terminals 27-1 and 27-2 of the capacitor element 20 are connected to the vias 156. The capacitor part 22 of the capacitor element 20 is connected between the power source conductive channel 126 and the grounding conductive channels 127-1 and 127-2.

As shown in FIG. 7, a distance a1 of a conductive channel between the top surface of the power source upper terminal 46 and the capacitor part 22, and a distance b1 of a conductive channel between the top surface of the grounding upper terminal 47-1 and the capacitor part 22 are both very short. Also, a distance a2 of a conductive channel between the top surface of the power source upper terminal 46 and another capacitor part 22, and a distance b2 of a conductive channel between the top surface of the grounding upper terminal 47-2 and the capacitor part 22 are both very short. Accordingly, parasitic inductance, which is inductance of the conductive channels, is very small.

Additionally, since the capacitor element 20 is thin and embedded in one resin layer 104, a thickness t20 of the substrate 100 is small. The thickness of the resin layer 104 is several dozen μm, for example.

Figure 9:
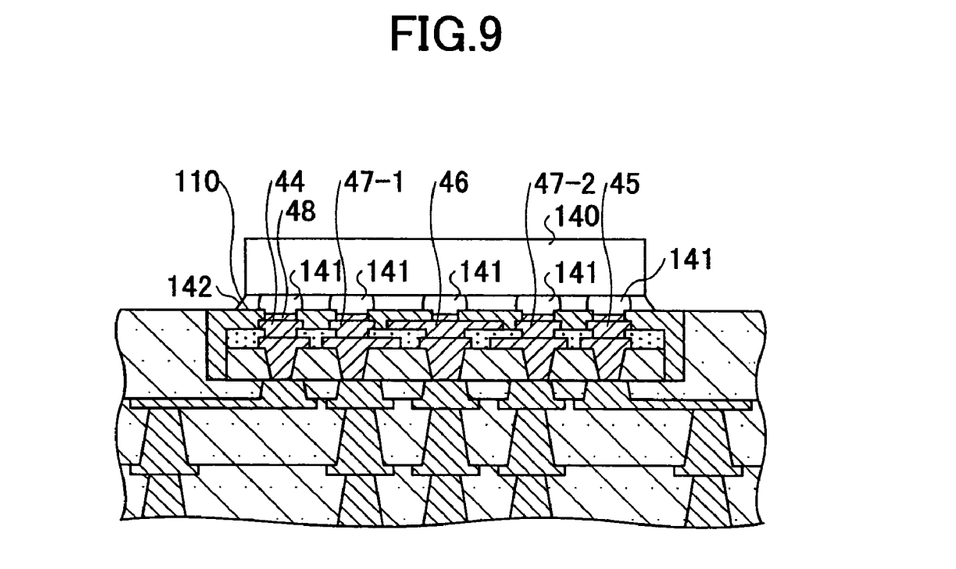
FIG. 9 is a schematic diagram showing a connection part of a semiconductor element and the capacitor element in an enlarged manner.

FIGS. 8 and 9 show the semiconductor device 130. In the semiconductor device 130, the semiconductor element 140 is mounted on the surface 110 of the substrate 100 shown in FIGS. 6 and 7 by flip chip bonding. The bumps 141 on the bottom surface of the semiconductor element 140 are connected to the signal upper terminals 44 and 45, the power source upper terminal 46, and the two grounding upper terminals 47-1 and 47-2 that are in the surface 110. 142 denotes an under fill.

The capacitor element 20 is arranged at a position beneath the semiconductor element 140. Hence, a conductive channel between the semiconductor element 140 and the capacitor element 20 is very short, and parasitic inductance, which is inductance of the conductive channel, is very small. Accordingly, even if the operating frequency of the semiconductor element 140 becomes higher, power supply voltage supplied to the semiconductor element 140 is maintained to be stable without being affected by the parasitic inductance.

In practice, the semiconductor element 140 is mounted on the capacitor element 20, and the capacitor element 20 has a coefficient of linear expansion that is substantially the same as that of the semiconductor element 140 made of silicon. Thus, in a case where the semiconductor element 140 generates heat at the time of operation, and the capacitor element 20 is heated by the semiconductor element 140, heat stress generated between the semiconductor element 140 and the capacitor element 20 is controlled to be small and improved.

Next, referring to FIGS. 10, 11, and 12, a description is given below of a manufacturing method of the substrate 100.

Figure 10:
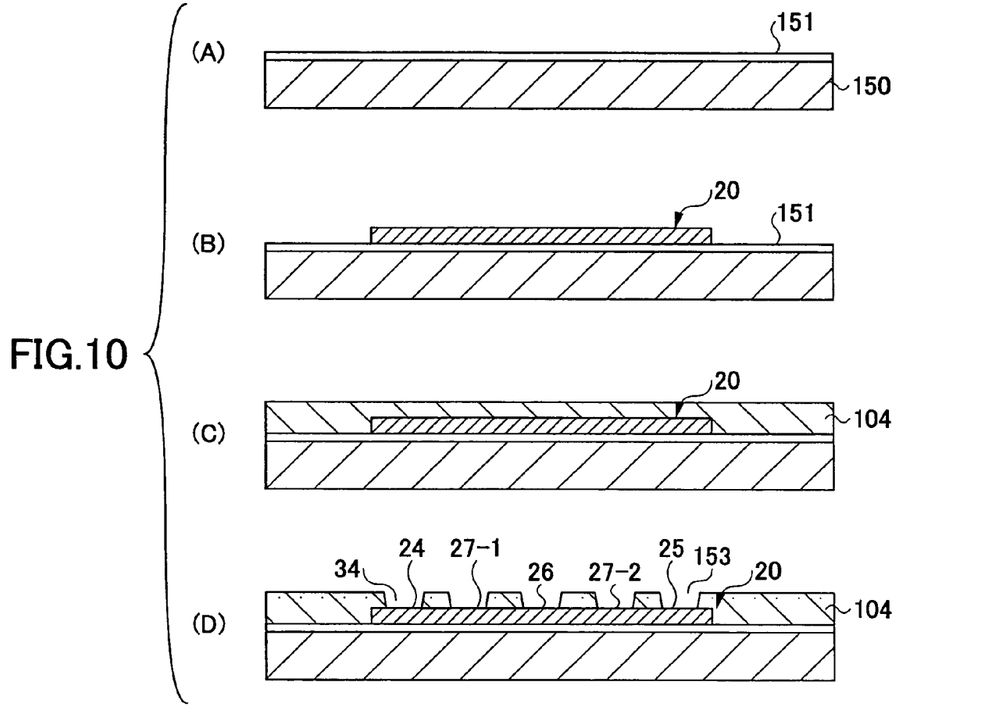
FIG. 10 is a schematic diagram showing a manufacturing flow of the semiconductor device substrate shown in FIG. 6.

First, as shown in FIG. 10-(A), a thin resin film 151 is formed by applying resin such as polyimide on the top surface of a metal plate 150 made of copper, for example.

Then, as shown in FIG. 10-(B), the capacitor element 20 shown in FIG. 2 is mounted on the thin resin film 151 with the position reversed from that shown in FIG. 2.

Then, as shown in FIG. 10-(C), the capacitor element 20 is laminated and covered by a resin layer 104 made of epoxy, for example. The resin layer 104 fills in clearances between the capacitor element 20 and the thin resin film 151.

Then, as shown in FIG. 10-(D), concave portions 153 for forming vias are formed in the resin layer 104 by laser processing or etching, for example. The signal lower terminals 24 and 25, the power source lower terminal 26, and the grounding lower terminals 27-1 and 27-2 are exposed at the bottom surfaces of the concave portions 153.

Figure 11:
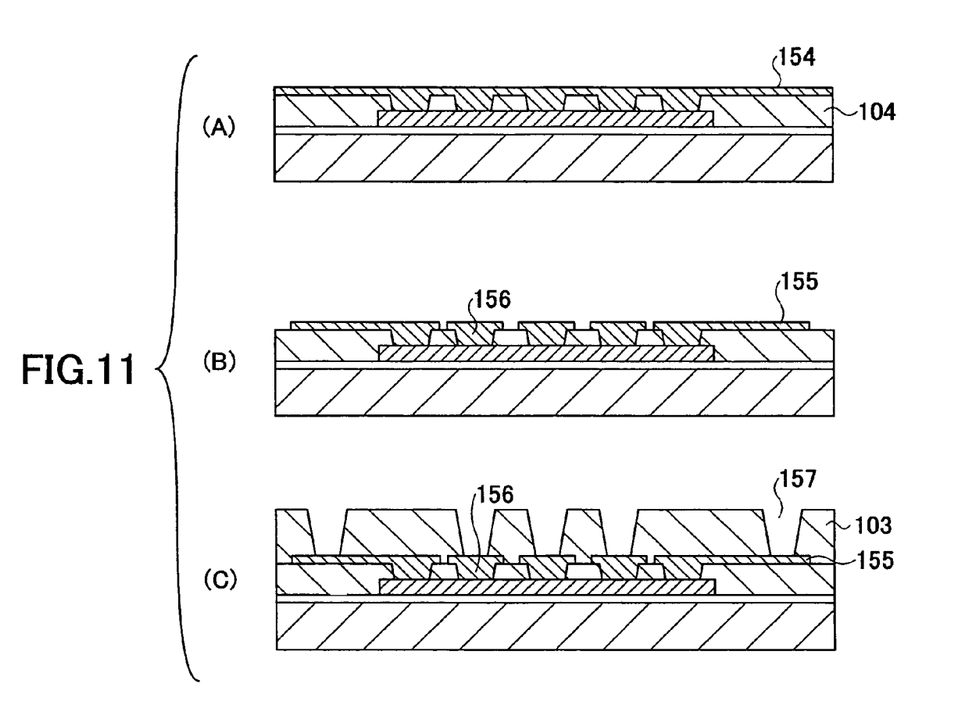
FIG. 11 is a schematic diagram showing the subsequent manufacturing flow of that shown in FIG. 10.

Then, as shown in FIG. 11-(A), a metal layer 154 is formed over the resin layer 104 by performing electroless copper plating and electrolytic copper plating. The metal layer 154 fills in the concave portions 153.

Then, as shown in FIG. 11-(B), a conductive pattern 155 and vias 156 are formed by patterning the metal layer 154 by a photolithography method.

Then, as shown in FIG. 11-(C), the conductive pattern 155 is laminated by a resin layer 103 such that the conductive pattern 155 is covered by the resin layer 103. Concave portions 157 for forming vias are formed in the resin layer 103 by laser processing or etching, for example. The conductive pattern 155 and the vias 156 are exposed from the bottom surfaces of the concave portions 157.

Figure 12:
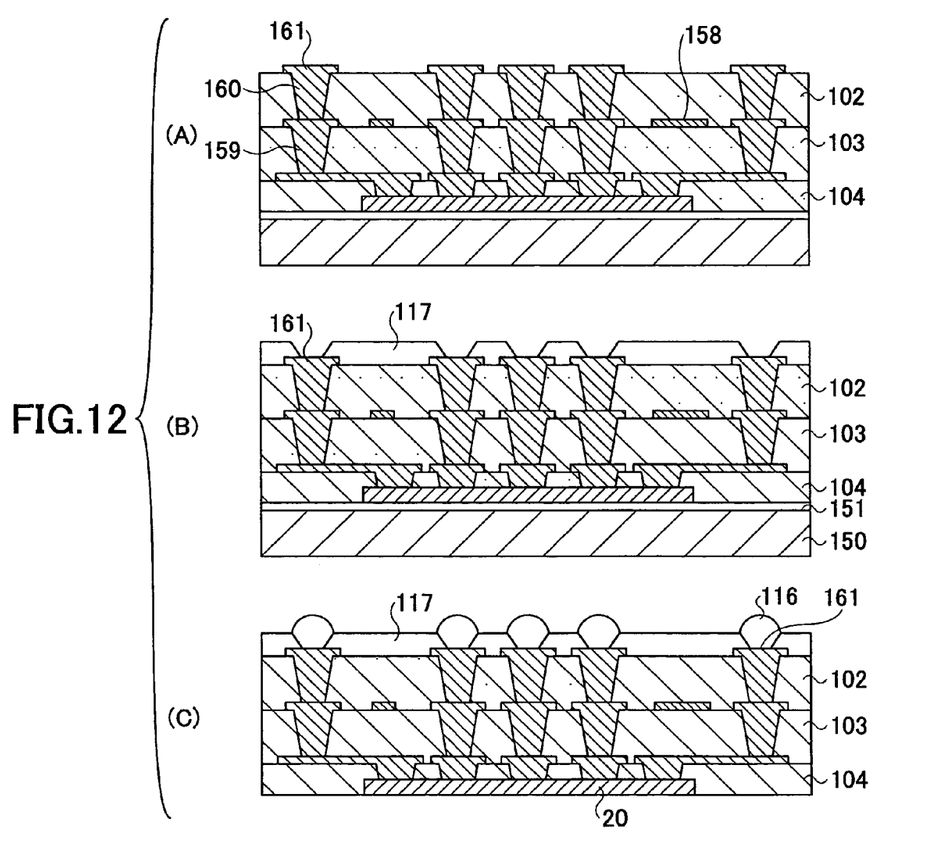
FIG. 12 is a schematic diagram showing the subsequent manufacturing flow of that shown in FIG. 11.

Then, as shown in FIG. 12-(A), a metal layer is formed over the resin layer 103. A conductive pattern 158 and vias 159 are formed by patterning the metal layer. Further, a resin layer 102 is formed on the resin layer 103, and concave portions for forming vias are formed in the resin layer 102. A metal layer is formed over the resin layer 102, and vias 160 and pads 161 are formed by patterning the metal layer.

Then, as shown in FIG. 12-(B), solder resist 117 is applied over the resin layer 102 except portions of the pads 161.

Finally, as shown in FIG. 12-(C), etching is performed on the metal plate 150 to remove the metal plate 150.

The process of etching performed on the metal plate 150 is stopped by the thin resin layer 151. Thus, excessive etching is prevented. After removing the metal plate 150, the thin resin layer 151 is removed by dry etching. The solder balls 116 are bonded to the pads 161 by placing and reflowing the solder balls 116 in the concave portions formed in the solder resist 117.

It is also possible to use the capacitor element 20, for other use, for example, by embedding the capacitor element 20 in a substrate other than the substrate 100.

As mentioned above, according to the present invention, since the base 21 is made of resin, it becomes easier to reduce the thickness of a capacitor element 20 and form vias, compared to the case of a capacitor element having a silicon substrate as the base. Thus, it becomes possible to more easily manufacture a capacitor element. In addition, since the capacitor element 20 may be made comparatively thinner, the thickness of a substrate (element mounting substrate) for mounting an element embedding the capacitor element 20 therein may also be reduced. Further, since the base 21 is made of a resin whose coefficient of linear expansion is adjusted, in the case where an element is mounted on the element mounting substrate embedding the capacitor element 20 therein, it is possible to control heat stress generated between the capacitor element 20 and the mounted element to be small.

In the above-mentioned capacitor element 20, the base 21 may include a filler and be made of epoxy resin whose coefficient of linear expansion is within the range of 5-30 ppm/K. In this case, since the base 21 is made of epoxy resin whose coefficient of linear expansion is within the range of 5-30 ppm/K, the coefficient of linear expansion of the capacitor element 20 becomes close to that of a semiconductor element having a silicon substrate. Consequently, when the semiconductor element is mounted on the semiconductor device substrate embedding the capacitor element 20 therein, it is possible to control heat stress generated between the capacitor element 20 and the mounted semiconductor element to be small.

Additionally, the base 21 may include a filler and be made of polyimide resin whose coefficient of linear expansion is within the range of 5-30 ppm/K. In this case, since the base 21 is made of polyimide resin whose coefficient of linear expansion is within the range of 5-30 ppm/K, the coefficient of linear expansion of the capacitor element 20 becomes close to that of a semiconductor element having a silicon substrate. Accordingly, in a case where the semiconductor element is mounted on the semiconductor device substrate embedding the capacitor element 20 therein, it is possible to control heat stress generated between the capacitor element 20 and the mounted semiconductor element to be small.

Additionally, the base 21 may be made of thermoplastic liquid crystal polymer whose coefficient of linear expansion is within the range of 5-30 ppm/K. In this case, since the base 21 is made of thermoplastic liquid crystal polymer whose coefficient of linear expansion is within the range of 5-30 ppm/K, the coefficient of linear expansion of the capacitor element 20 becomes close to that of a semiconductor element having a silicon substrate. Thus, in a case where the semiconductor element is mounted on the semiconductor device substrate embedding the capacitor element 20 therein, it is possible to control heat stress generated between the capacitor element 20 and the mounted semiconductor element to be small.

Additionally, the base 21 may include aramid fiber and be made of the resin whose coefficient of linear expansion is within the range of 5-30 ppm/K. In this case, since the base 21 is made of the resin whose coefficient of linear expansion is within the range of 5-30 ppm/K, the coefficient of linear expansion of the capacitor element 20 becomes close to that of a semiconductor element having a silicon substrate. Thus, in a case where the semiconductor element is mounted on the substrate embedding the capacitor element 20 therein, it is possible to control heat stress generated between the capacitor element 20 and the mounted semiconductor element to be small.

Additionally, with the manufacturing method of a capacitor element 20 according to the present invention, since the base 21 made of resin is used, formation of the vias becomes easier compared to a case where a silicon substrate is used. Thus, it becomes possible to reduce the time interval required for an operation to form the vias. In addition, since the base 21 is made of insulative resin, it becomes possible to directly form a conductive layer on the top surface of the base 21 without forming an insulating film. Accordingly, compared to the case where a silicon substrate is used, manufacturing processes are reduced.

Additionally, with the semiconductor device substrate according to the present invention, since the capacitor element includes the base 21 made of resin and thus the thickness of the capacitor element 20 is reduced, it also becomes possible to reduce the thickness of the semiconductor device substrate. In addition, the top surface of the capacitor element 20 serves as a semiconductor element mounting surface. Thus, the length of a conductive channel between the capacitor part and the semiconductor element mounting surface is shortened to such an extent that the length cannot be made any shorter. Accordingly, it becomes possible to reduce parasitic inductance, which is inductance of the conductive channel between the capacitor part and terminals on the semiconductor element mounting surface, to such an extent that the parasitic inductance cannot be reduced any further. Hence, even if a semiconductor element is mounted that is operated at a high speed and is subject to parasitic inductance, power supply voltage is stabilized. Thus, it is possible to realize a semiconductor device substrate suitable for mounting a semiconductor element operated at a high speed.

Additionally, with the semiconductor device according to the present invention, since the semiconductor element is mounted on the exposed top surface of the capacitor element 20, the length of a conductive channel between the mounted semiconductor element and the capacitor part is shortened to such an extent that the length cannot be made any shorter. Accordingly, it becomes possible to reduce parasitic inductance, which is inductance of the conductive channel between the mounted semiconductor element and the capacitor part, to such an extent that the parasitic inductance cannot be reduced any further. Hence, even if a semiconductor element is mounted that is operated at a high speed and is subject to the parasitic inductance, power supply voltage is stabilized compared to conventional techniques. In addition, it is possible to control heat stress generated between the capacitor element 21 and the semiconductor element to be small.

The present invention is not limited to the specifically disclosed embodiments, and variations and modifications may be made without departing from the scope of the present invention.

The present application is based on Japanese priority application No. 2003-49716 filed on Feb. 26, 2003, the entire contents of which are hereby incorporated by reference.

What is claimed is:

1. A method of manufacturing a capacitor element, comprising the steps of:
   applying on a surface of a base material a base made of a resin whose coefficient of linear expansion is adjusted in accordance with a coefficient of linear expansion of a semiconductor element that is mounted on said capacitor element to fall within a range of 5 ppm/K to 30 ppm/K;
   forming vias in the base;
   forming a first conductive layer on a top surface of the base;
   patterning the first conductive layer so as to form terminals filling in the vias and lower electrodes extending to the top surface of the base;
   forming a dielectric layer on said lower electrodes;
   forming a second conductive layer on a top surface of the dielectric layer; and
   patterning the second conductive layer so as to form on the dielectric layer an upper electrode opposing said lower electrodes and so as to form a terminal having an exposed top surface.

2. The method as claimed in claim 1, further comprising the step of;
   releasing the base material to thereby form the capacitor element.

3. The method as claimed in claim 1, wherein the base is made of an epoxy resin including a filler for adjusting a coefficient of linear expansion of the epoxy resin.

4. The method as claimed in claim 1, wherein the base is made of a polyimide resin including a filler for adjusting a coefficient of linear expansion of the polyimide resin.

5. The method as claimed in claim 1 wherein the base is made of a thermoplastic liquid crystal polymer.

6. The method as claimed in claim 1, wherein the base is made of a resin including aramid fiber for adjusting a coefficient of linear expansion of the resin.

7. A method of manufacturing a capacitor element that is configured to mount a semiconductor element thereon, said method comprising:
   preparing a base, having a top surface and a bottom surface, and made of a resin whose coefficient of linear expansion is adjusted in accordance with a coefficient of linear expansion of the semiconductor element, that is to be mounted on said capacitor element, to fall within a range of 5 ppm/K to 30 ppm/K;
   forming a capacitor part, including two opposing electrodes and a dielectric layer interposed therebetween, in an embedded manner in the base, so that one of said two opposing electrodes is exposed at the top surface of the base to serve as a surface on which the semiconductor element is mounted and the other of said two opposing electrodes is exposed at the bottom surface of the base.

8. The method of manufacturing a capacitor element as claimed in claim 7, wherein the base is made of a material selected from a group consisting of an epoxy resin including a filler for adjusting a coefficient of linear expansion of the epoxy resin, a polyimide resin including a filler for adjusting a coefficient of linear expansion of the polyimide resin, a thermoplastic liquid crystal polymer, and a resin including aramid fiber for adjusting a coefficient of linear expansion of the resin.

9. A method of assembling a semiconductor device substrate on which a semiconductor element having a substrate is to be mounted, said method comprising the steps of:
preparing a substrate body having a bottom surface that serves as a mounting surface in which external connection terminals are arranged; and
forming a capacitor element in an embedded manner in the substrate body, said capacitor element including a base having a top surface and a bottom surface and made of a resin whose coefficient of linear expansion is adjusted in accordance with the semiconductor element to be mounted to a value between a coefficient of linear expansion of the substrate body and a coefficient of linear expansion of the substrate of the semiconductor element, and a capacitor part including two opposing electrodes and a dielectric layer interposed therebetween, so that one of said two opposing electrodes is exposed at the top surface of the base to serve as a surface on which the semiconductor element is mounted and the other of said two opposing electrodes is exposed at the bottom surface of the base.

10. The method of assembling a semiconductor device substrate as claimed in claim 9, wherein the resin has a coefficient of linear expansion close to the coefficient of linear expansion of the substrate of the semiconductor element.

11. The method of assembling a semiconductor device substrate as claimed in claim 9, wherein the resin has a coefficient of linear expansion in a range of 5 ppm/K to 30 ppm/K.

12. The method of assembling a semiconductor device substrate as claimed in claim 9, wherein the resin is selected from a group consisting of an epoxy resin including a filler for adjusting a coefficient of linear expansion of the epoxy resin, a polyimide resin including a filler for adjusting a coefficient of linear expansion of the polyimide resin, a thermoplastic liquid crystal polymer, and a resin including aramid fiber for adjusting a coefficient of linear expansion of the resin.

* * * * *